(12) United States Patent
Zuffada et al.

(10) Patent No.: US 8,253,473 B2
(45) Date of Patent: Aug. 28, 2012

(54) INTEGRATED CIRCUIT OF AN INTEGRATOR WITH ENHANCED STABILITY AND RELATED STABILIZATION METHOD

(75) Inventors: Maurizio Zuffada, Milan (IT); Massimo Pozzoni, Pavia (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 100 days.

(21) Appl. No.: 12/893,908

(22) Filed: Sep. 29, 2010

(65) Prior Publication Data

US 2011/0080218 A1 Apr. 7, 2011

(30) Foreign Application Priority Data

Oct. 1, 2009 (IT) .............. VA2009A0061

(51) Int. Cl.
G06F 7/64 (2006.01)
G06G 7/18 (2006.01)
G06G 7/19 (2006.01)
(52) U.S. Cl. ......... 327/336; 327/344; 327/345; 330/278
(58) Field of Classification Search .................. 327/336, 327/344, 345; 330/253, 278
See application file for complete search history.

(56) References Cited

U.S. PATENT DOCUMENTS

2010/0141340 A1* 6/2010 Huang et al. .................. 330/253

FOREIGN PATENT DOCUMENTS

| EP | 0365091 | 4/1990 |
|---|---|---|
| EP | 1578013 | 9/2005 |

* cited by examiner

*Primary Examiner* — John Poos
(74) *Attorney, Agent, or Firm* — Allen, Dyer, Doppelt, Milbrath & Gilchrist, P.A.

(57) ABSTRACT

An integrated circuit integrator includes a first transconductance amplifier having a gain adjustable based upon a first control signal, and receives, as an input, a signal to be filtered, and generates, as an output, a corresponding amplified signal. The first transconductance amplifier includes an R-C output circuit to filter components from the amplified signal, and an output resistance being adjustable based upon a second control signal. A second transconductance amplifier is matched with the first transconductance amplifier, and has a gain adjustable based upon the first control signal, and a matched output resistance adjustable based upon the second control signal. A circuit is configured to force a reference current through the matched output resistance. An error correction circuit is coupled to the second transconductance amplifier and is configured to generate the second control signal so as to keep constant a voltage on an output of the second transconductance amplifier.

18 Claims, 4 Drawing Sheets

INTEGRATED CIRCUIT OF AN INTEGRATOR WITH ENHANCED STABILITY AND RELATED STABILIZATION METHOD

FIELD OF THE INVENTION

This invention relates to integrated circuit devices, and, more particularly, to an elementary integrator cell having a stable voltage gain.

BACKGROUND OF THE INVENTION

Numerous analog mixed-signal integrated circuits contain continuous-time filters based on elementary integrator cells that generally include a tunable transconductance amplifier (Gi) and a capacitor (Ci). Elementary integrator cells (Gi, Ci) are often building blocks of more complex circuits.

An exemplary integrator is shown in FIG. 1. The meaning of each block is summarized in the following table:

| | |
|---|---|
| Gi | input transconductance amplifier |
| Gmi | transconductance amplifier matched with Gi |
| Aio | error amplifier |
| DAC | Digital-to-Analog Converter |
| Vr | reference voltage |
| Vi | input voltage |
| Vo | output voltage |
| Ri | output resistance of the transconductance amplifier |
| Ci | filter capacitor |
| Rr | reference resistor |
| Vg | transconductance control signal |

The resistance Ri may be the finite output impedance of the transconductance amplifier Gi (due to the finite output impedance of the electronic components constituting the transconductance amplifier) or a resistive element (a resistor or an active device adapted to behave as a resistor) connected at the output of the transconductance amplifier, or a combination of the two.

The transfer function of the integrator of FIG. 1 is:

$$F(f) = \frac{G_i R_i}{1 + i2\pi f \cdot C_i R_i} \quad (1)$$

The depicted circuit (Gi-Ci) nominally behaves like an integrator having its 0 dB crossing frequency at $f_i = G_i/2\pi C_i$, wherein the transconductance gain Gi may be fixed in a very large range of values.

The error amplifier Aio adjusts the gain of the transconductance amplifier Gi and of the matched transconductance amplifier Gmi in order to nullify the difference between the reference current output by the DAC and the current Gmi*Vr of the transconductance amplifier Gmi:

$$G_{mi} = \frac{G_{DAC}}{R_r} \quad (2)$$

wherein GDAC is the programmable current gain of the digital-to-analog converter. Using the reference resistor Rr that may be an external resistor, or a resistor with a minimal dependence from process spread and/or supply voltage and temperature fluctuations, the transconductance gain Gmi is adjusted by the control loop for compensating such possible fluctuations, and is tunable by adjusting the gain of the DAC.

When the amplifiers Gi and Gmi are matched, their transconductance may substantially vary according to the same law. However, the transconductance gain Gi and the resistance Ri, and thus also the voltage gain (Gi Ri) of the integrator cell are influenced by process spread, supply voltage, and temperature fluctuations (PVT). This makes the phase of the transfer function of the integrator cell at the crossing frequency fi different from 90°, as it would be in an ideal integrator, and causes a PVT-dependent phase shift. This phase shift may affect the frequency response of filters based on integrator cells, especially if they function at high frequencies and are tunable over a wide frequency range.

SUMMARY OF THE INVENTION

An integrated architecture of an integrator that overcomes the above criticalnesses and inconveniences has been found. According to this disclosure, the output resistance of the input transconductance amplifier Gi of the integrator is made independently adjustable from the transconductance gain Gi through a dedicated control signal, and also includes a matched transconductance amplifier Gi2 having an adjustable gain and an output resistance matched with that of the first transconductance amplifier Gi, and adjusted by the same dedicated control signal. A reference current is forced through the matched output resistance, and the dedicated control signal is generated such to keep the output voltage of the matched transconductance amplifier relatively constant.

A method of stabilization against PVT variations of the integrated circuit of an integrator is also disclosed herein.

DETAILED DESCRIPTION OF THE PREFERRED EMBODIMENTS

Figure 1:
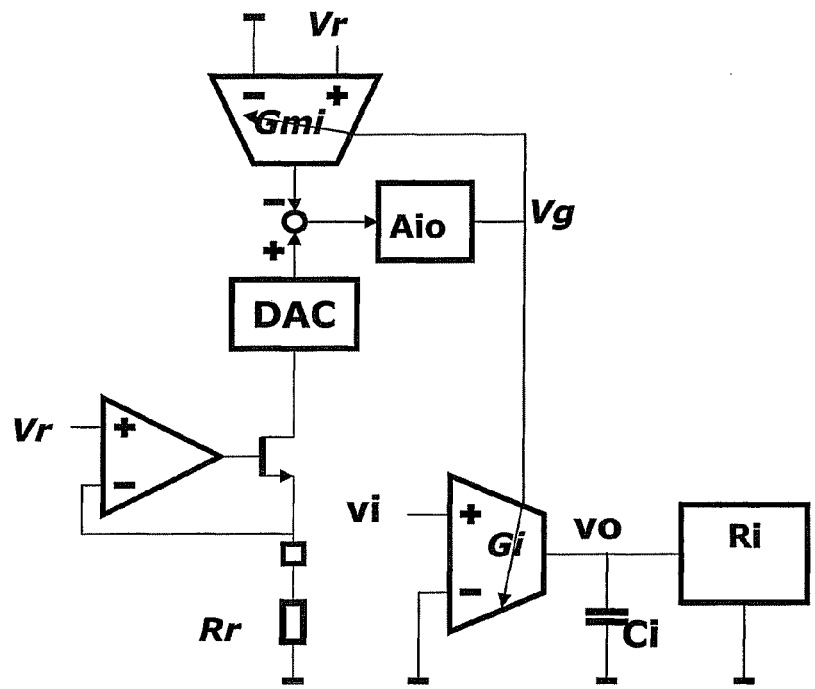
FIG. 1 depicts the architecture of an elementary integrator cell, in accordance with the prior art.
Figure 2:
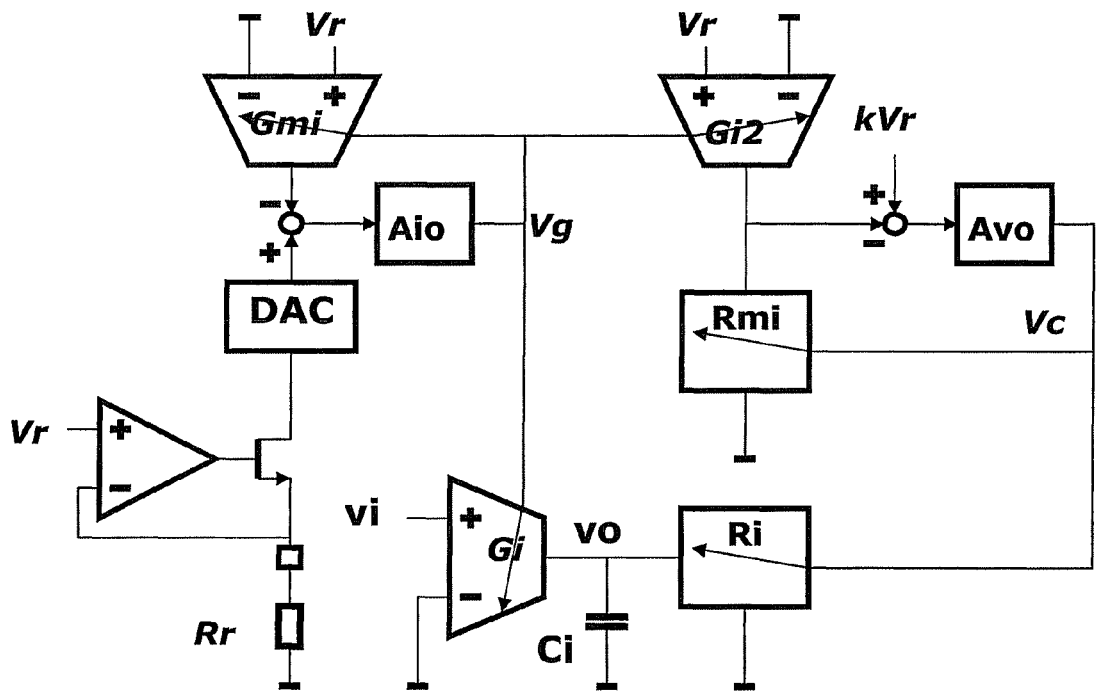
FIG. 2 depicts an embodiment of the elementary integrator cell of this disclosure.

A single-end integrator according to a first embodiment is depicted in FIG. 2. Differently from the known architecture of FIG. 1, in the integrator cell of the present disclosure the output resistance of the input transconductance amplifier Gi is adjustable through a second control signal Vc, for example by virtue of an adjustable resistive element Ri electrically connected in parallel to the capacitor Ci. The cell comprises a second control loop Gi2-Rmi-Avo, for example. This second control loop includes a co-integrated transconductance amplifier Gi2 matched with the input transconductance amplifier Gi and having an adjustable output resistance Rmi matched with the output resistance Ri and adjusts the resistances Rmi and Ri in function of the second control signal Vc, in order to keep the voltage on the output of the transconductance amplifier Gi2 relatively constant.

This second control loop generates a voltage that varies with fluctuations of the matched resistance Rmi, subtracts it from a constant voltage kVr, and generates the control signal Vc as an amplified replica of the difference with the error voltage amplifier Avo. The output resistance Ri is adjusted by the same dedicated control signal.

The second error amplifier Avo has a gain designed to help ensure an adequate response of the second control loop, and adjusts the resistance Rmi to make $$Gi2Rmi=kVr=\text{constant} \tag{3}$$

even in case of PVT induced fluctuations. The matching between Gi2 and Gi and between Rmi and Ri fixes the phase of the integrator cell at the 0 dB crossing, independently from PVT induced fluctuations for a large range of frequencies, tunable through the DAC value.

The output resistance Rmi of the matched transconductance amplifier Gi may be the finite output impedance of the transconductor cell (due to the finite output impedance of the electronic devices making the transconductor cell), a resistive element placed at the output of the transconductor (a resistor or an active device behaving like a resistor), or a combination of the two.

The particular implementation of the two control loops in FIG. 2 is an example of the numerous manners in which the integrator cell may be implemented to ensure the above noted relation (3). Any skilled person may easily find innumerable alternative ways to implement control loops adapted to satisfy equation (3) to enhance PVT stability of continuous-time filters.

In the example shown in FIG. 2, a reference voltage Vr is applied at the input of the transconductance amplifier Gi to generate an output voltage that will be kept equal to a reference voltage k*Vr by the control loop by the second error amplifier Avo.

Figure 3:
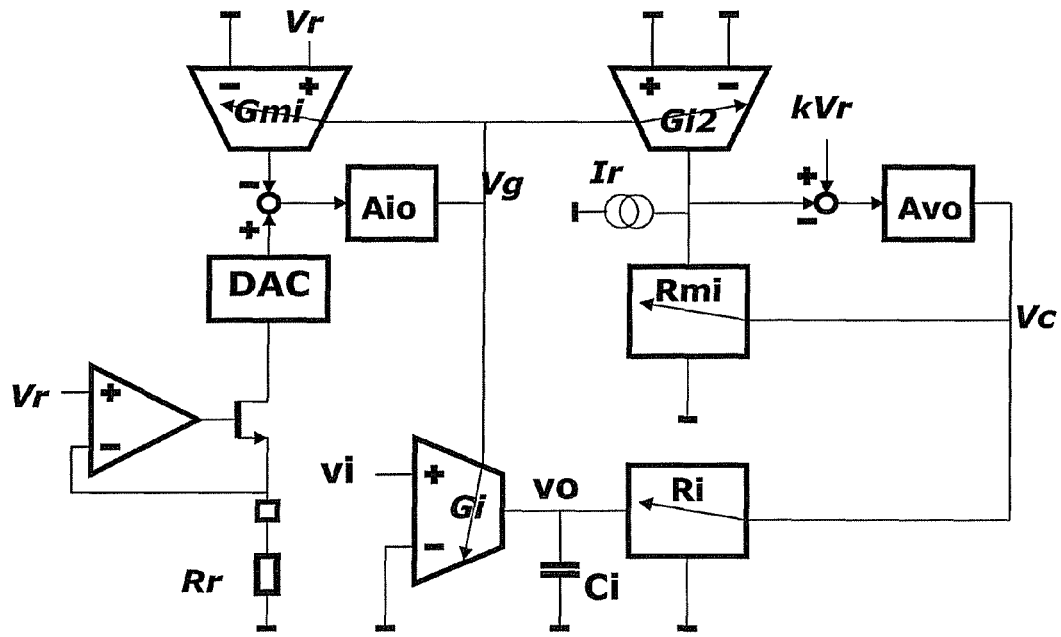
FIG. 3 depicts another embodiment of the elementary integrator cell of this disclosure.

According to an alternative embodiment illustrated in FIG. 3, a reference current (Ir) is forced through the matched resistive element Rmi to generate an output voltage (Ir*Rmi) that will be kept equal to a reference voltage k*Vr by the control loop. In this case, $$Rmi=k*Vr/Ir=\text{constant} \tag{4}$$

Figure 4:
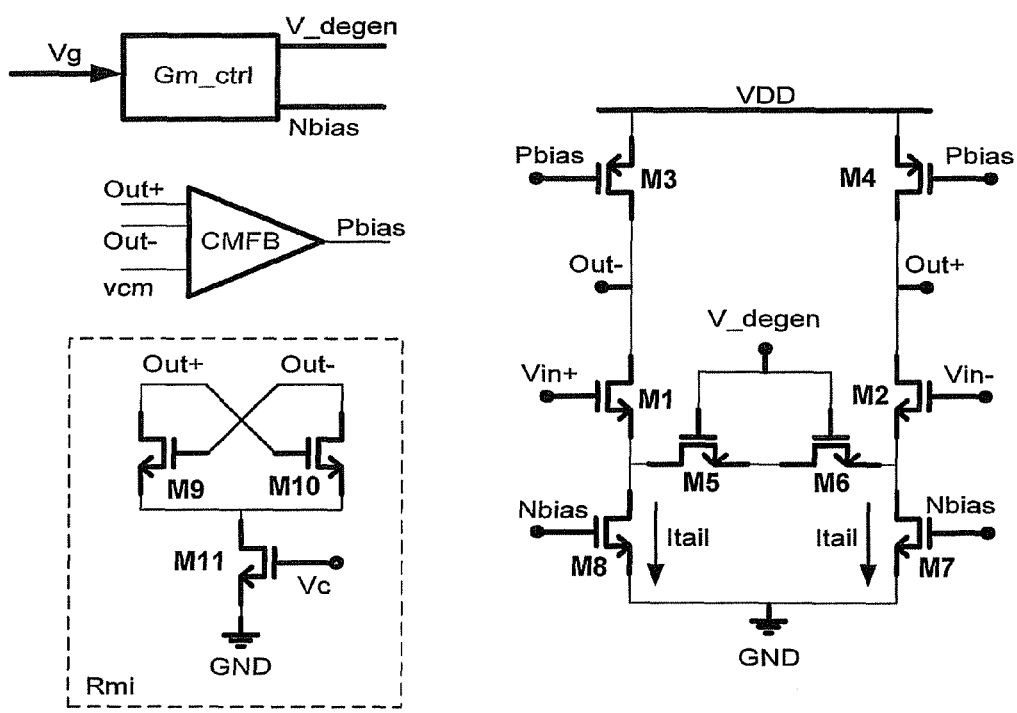
FIG. 4 depicts yet another embodiment of the elementary integrator cell of this disclosure.
Figure 6:
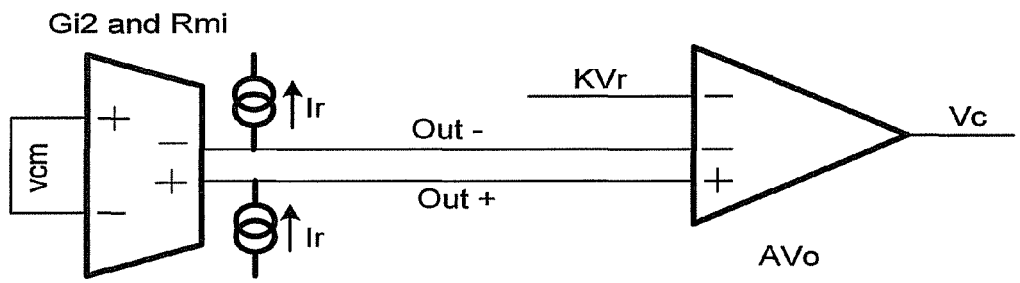
FIG. 6 depicts a circuit for adjusting the output resistance of FIGS. 3, 4, and 5.

An exemplary embodiment of the adjustable transconductance amplifier Gi and of the matched adjustable resistive element Rmi will now be described. In addition, an embodiment of the second control loop of the integrator cell realized in differential circuit form is depicted in FIGS. 4 and 6.

The transconductance amplifier Gi2 includes the devices M1-M8. The matched resistive element Rmi includes the devices M9-M11. The NMOS devices M1, M2 may be a differential pair, fed by the input signal Vin+/Vin− and by the tail current sources M7, M8.

The skilled person will immediately understand that it is not indispensable to realize tail current sources using the depicted MOSFETs M7, M8 and will be immediately capable of identifying in the relevant literature other usable architectures of tail current sources.

The transistors M5, M6 act as variable degenerating resistors to increase the linearity of the input differential pair. They may be replaced with a short circuit if no linearity improvement is desired, or substituted by other linearization circuitry.

The PMOS M3, M4 work as an active load. The current supplied by M3, M4 is set by a common-mode feedback amplifier CMFB that forces the common mode (Out++ Out−)/2 to match a reference common mode Vcm. The active load M3-M4 and its relative common mode control may be substituted by any other kind of controlled active loads.

The finite output resistance of the transconductance amplifier Gmi of FIG. 4 is due to the finite output resistances of the active load M3-M4 and by the finite output resistances of the differential pair M1-M2. In the embodiment depicted in FIG. 4, the overall output resistance is given by the parallel of the Gmi output resistance and of the Rmi resistance, and it may be adjusted by adjusting the resistance Rmi.

The adjustable resistance Rmi is realized with the devices M9, M10, M11, that behave as a negative resistance. The value of this negative resistance is controlled by the proposed control loop by setting the voltage Vc, that fixes the current flowing through the devices M9, M10 and, as a result, their transconductance.

Figure 5:
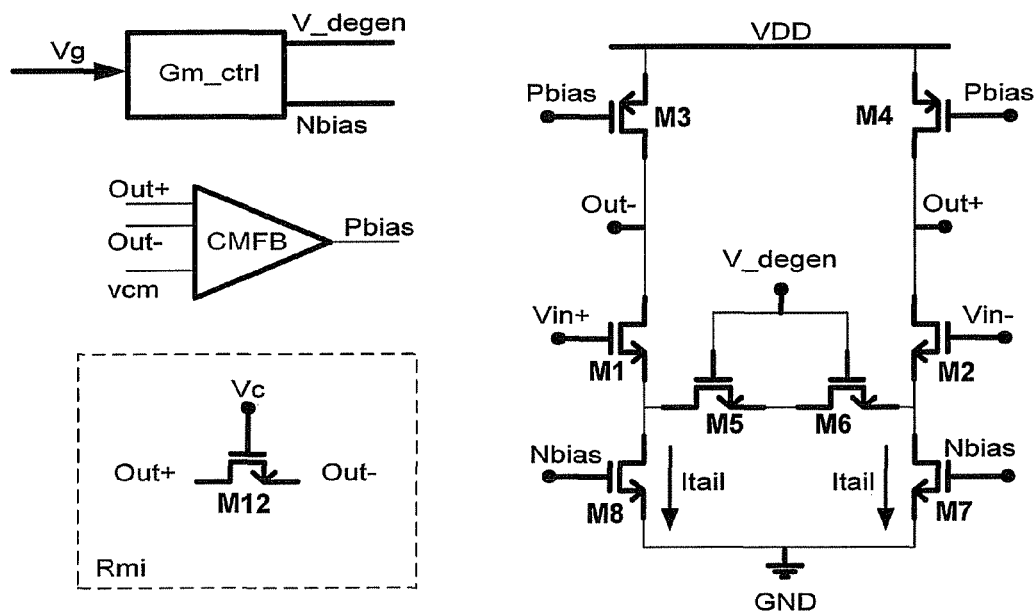
FIG. 5 depicts yet another embodiment of the elementary integrator cell of this disclosure.

Alternative embodiments of variable resistances (either positive or negative) are possible. As an example, in FIG. 5, the negative resistance devices have been replaced by the MOS device M12 that works as a variable positive resistance, controlled by the control voltage Vc.

An exemplary embodiment of the circuit that adjusts the resistance is shown in FIG. 6. The transconductance amplifier Gi2 is input with a null differential voltage. A differential reference current Ir is injected into the output node of Gi2. The differential voltage (Out+−Out−) is compared with a constant reference kVr to generate the control voltage Vc.

Exemplary application of the integrator cell to a 1st order LPF will now be discussed. In the following, the above circuit is applied, as an example, to a 1st order low pass filter.

Figure 7:
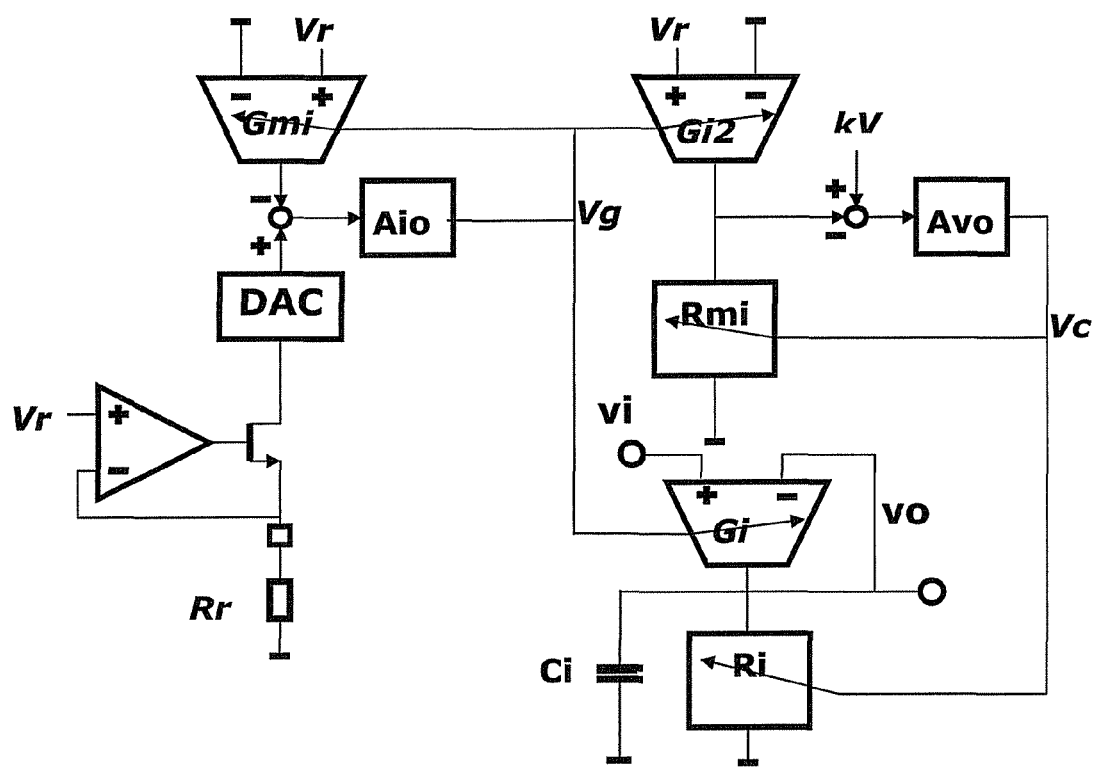
FIG. 7 depicts an embodiment of a first order LPF employing the elementary integrator cell of this disclosure.

FIG. 7 shows the two master loops driving a 1st order LPF, whose transfer function A(ω) is described by the following equation:

$$A(\omega) = \frac{1}{1 + 1/G_i R_i + j\omega C_i / G_i} \tag{5}$$

and its group delay Tg(ω) is:

$$Tg(\omega) = \frac{C_i / G_i (1 + 1/G_i R_i)}{1 + (\omega C_i / G_i (1 + 1/G_i R_i))^2} \tag{6}$$

The LPF characteristics are similar or identical to those obtainable with an ideal integrator, provided that the capacitance Ci of the non ideal integrator may be multiplied by a factor (1+1/k), being k=GiRi.

If, by the two control loops and by layout matching, Gi=Gmi=Gi2=DAC/Rr and GiRi=k=constant, equations (5) and (6) are independent from any PVT variations, and the filter is tunable through the current converter DAC.

The 3 dB-frequency of the transfer function of equation (5) is:

$$f_{3dB} = \frac{(1 + 1/k) \cdot G_{DAC}}{2\pi R_r C_i} \tag{7}$$

that is clearly independent from PVT fluctuations and is tunable by setting the gain GDAC.

That which is claimed is:

1. An integrated circuit integrator comprising:
a first transconductance amplifier having a gain adjustable based upon a first control signal, and configured to receive, as an input, a signal to be filtered, and configured to generate, as an output, a corresponding amplified signal;

said first transconductance amplifier comprising an R-C output circuit to filter components from the amplified signal, said first transconductance amplifier having an output resistance being adjustable based upon a second control signal;

a second transconductance amplifier matched with said first transconductance amplifier, having a gain adjustable based upon the first control signal, said second transconductance amplifier having a matched output resistance adjustable based upon the second control signal;

a circuit configured to force a reference current through the matched output resistance; and an error correction circuit coupled to said second transconductance amplifier and configured to generate the second control signal so as to keep constant a voltage on an output of said second transconductance amplifier.

2. The integrated circuit integrator of claim 1, wherein said error correction circuit comprises:

an adder configured to generate an error voltage signal as a difference between the voltage on the output of said second transconductance amplifier and a reference voltage; and a voltage error amplifier configured to generate the second control signal as an amplified replica of the error voltage signal.

3. The integrated circuit integrator of claim 2, further comprising a constant current generator configured to force a reference current through the output resistance of said second transconductance amplifier.

4. The integrated circuit integrator of claim 2, wherein said circuit configured to force the reference current comprises said second transconductance amplifier input with a constant reference voltage.

5. The integrated circuit integrator of claim 3 further comprising:

a control circuit configured to generate the first control signal for adjusting the gain of said first transconductance amplifier to compensate for fluctuations of gain induced by process voltage and temperature (PVT) variations;

said control circuit comprising a third transconductance amplifier input with a constant reference voltage, having a gain adjustable based upon the first control signal and matched with the gain of said first transconductance amplifier, a circuit configured to generate the reference current, a second adder configured to generate an error current signal as a difference between the reference current and a current delivered by said third transconductance amplifier, and an error current amplifier configured to generate the first control signal as an amplified replica of the error current signal.

6. The integrated circuit integrator of claim 1, wherein each transconductance amplifier is differential and comprises:

a differential pair of input transistors biased with a tail current by a current source controlled based upon a bias adjustment command;

the differential pair of input transistors being coupled to a degeneration load adjustable based upon a degeneration adjustment command being coupled to a supply line through active loads adjustable based upon a load adjustment command upon which a differential output voltage is produced;

a transconductance gain control circuit input with the first control signal and configured to generate the load adjustment command and the degeneration adjustment command to fix a transconductance gain of said amplifier to a level of the first control signal;

an adjustable resistive element coupled between differential output nodes and controlled by the second control signal; and a common mode error amplifier input with the differential output voltage and a reference common mode voltage, and configured to generate the load adjustment command as an amplified replica of a difference between the differential output voltage and the reference common mode voltage.

7. The integrated circuit integrator of claim 6, wherein said adjustable resistive element comprises a transistor controlled by the second control signal and coupled between the differential output nodes.

8. The integrated circuit integrator of claim 6, wherein said adjustable resistive element comprises a second differential pair of transistors controlled by the differential output voltage, biased through first current terminals coupled together by a transistor referred to a ground node, and controlled by the second control signal, a second current terminal of each transistor of the second differential pair being respectively shorted to a control node of an other transistor of the second differential pair.

9. An integrated circuit integrator comprising:

a first transconductance amplifier having a gain adjustable based upon a first control signal, and configured to receive, as an input, a signal to be filtered, and configured to generate, as an output, a corresponding amplified signal;

said first transconductance amplifier comprising an R-C output circuit to filter components from the amplified signal, said first transconductance amplifier having an output resistance being adjustable based upon a second control signal;

a second transconductance amplifier matched with said first transconductance amplifier, having a gain adjustable based upon the first control signal, said second transconductance amplifier having a matched output resistance adjustable based upon the second control signal;

a circuit configured to force a reference current through the matched output resistance;

an error correction circuit coupled to said second transconductance amplifier and comprising an adder configured to generate an error voltage signal as a difference between the voltage on the output of said second transconductance amplifier and a reference voltage, and a voltage error amplifier configured to generate the second control signal as an amplified replica of the error voltage signal to thereby keep constant a voltage on an output of the second transconductance amplifier; and a constant current generator configured to force the reference current through the output resistance of said first transconductance amplifier.

10. The integrated circuit integrator of claim 9 further comprising:

a control circuit configured to generate the first control signal for adjusting the gain of said first transconductance amplifier to compensate for fluctuations of gain induced by PVT variations;

said control circuit comprising
a third transconductance amplifier input with a constant reference voltage, having a gain adjustable based upon the first control signal and matched with the gain of said first transconductance amplifier,
a circuit configured to generate the reference current,
a second adder configured to generate an error current signal as a difference between the reference current and a current delivered by said third transconductance amplifier, and
an error current amplifier configured to generate the first control signal as an amplified replica of the error current signal.

11. The integrated circuit integrator of claim 9, wherein each transconductance amplifier is differential and comprises:
a differential pair of input transistors biased with a tail current by a current source controlled based upon a bias adjustment command;
the differential pair of input transistors being coupled to a degeneration load adjustable based upon a degeneration adjustment command being coupled to a supply line through active loads adjustable based upon a load adjustment command upon which a differential output voltage is produced;
a transconductance gain control circuit input with the first control signal and configured to generate the load adjustment command and the degeneration adjustment command to fix a transconductance gain of said amplifier to a level of the first control signal;
an adjustable resistive element coupled between differential output nodes and controlled by the second control signal; and
a common mode error amplifier input with the differential output voltage and a reference common mode voltage, and configured to generate the load adjustment command as an amplified replica of a difference between the differential output voltage and the reference common mode voltage.

12. A method of stabilizing an integrated circuit integrator against process voltage and temperature (PVT) variations, the integrator including a first transconductance amplifier having a gain adjustable based upon a first control signal, configured to receive, as an input, a signal to be filtered, and configured to generate, as an output, a corresponding amplified signal, and an R-C output circuit to filter high-frequency components from the amplified signal, the method comprising:
electrically coupling, in parallel, an output impedance of the transconductance amplifier and a resistive element, a resistance of the resistive element being adjustable through a second control signal;
coupling, to the first transconductance amplifier, a first transconductance amplifier matched therewith and receiving the signal as an input, and having a gain adjustable based upon the first control signal, and an output resistance matched with a resistance of the R-C output circuit and being adjustable based upon the second control signal;
forcing a reference current through the output resistance of the second transconductance amplifier; and
generating the second control signal so as to keep a voltage on an output of the second transconductance amplifier constant.

13. A method of making an integrated circuit integrator comprising:

configuring a first transconductance amplifier to have a gain adjustable based upon a first control signal, and to receive, as an input, a signal to be filtered, and to generate, as an output, a corresponding amplified signal;
configuring an output resistance of the first transconductance amplifier to be adjustable based upon a second control signal;
the first transconductance amplifier comprising a R-C output circuit to filter high-frequency components from the amplified signal;
coupling a second transconductance amplifier to the first transconductance amplifier, and configuring the second transconductance amplifier to have a gain adjustable based upon the first control signal and a matched output resistance adjustable based upon the second control signal;
configuring a circuit to force a reference current through the matched output resistance; and
coupling an error correction circuit to the second transconductance amplifier and configuring the error correction circuit to generate the second control signal so as to keep constant a voltage on an output of the second transconductance amplifier.

14. The method of claim 13, wherein the error correction circuit comprises:
an adder configured to generate an error voltage signal as a difference between the voltage on the output of the second transconductance amplifier and a reference voltage; and
a voltage error amplifier configured to generate the second control signal as an amplified replica of the error voltage signal.

15. The method of claim 14, further comprising configuring a constant current generator to force a reference current through the output resistance of the first transconductance amplifier.

16. The method of claim 14 further comprising:
configuring a control circuit to generate the first control signal for adjusting the gain of the first transconductance amplifier to compensate for fluctuations of gain induced by PVT variations;
the control circuit comprising
a third transconductance amplifier input with a constant reference voltage, having a gain adjustable based upon the first control signal and matched with the gain of the first transconductance amplifier,
a circuit configured to generate the reference current,
a second adder configured to generate an error current signal as a difference between the reference current and a current delivered by the third transconductance amplifier, and
an error current amplifier configured to generate the first control signal as an amplified replica of the error current signal.

17. The method of claim 13, wherein each transconductance amplifier is differential and comprises:
a differential pair of input transistors biased with a tail current by a current source controlled based upon a bias adjustment command;
the differential pair of input transistors being coupled to a degeneration load adjustable based upon a degeneration adjustment command being coupled to a supply line through active loads adjustable based upon a load adjustment command upon which a differential output voltage is produced;
a transconductance gain control circuit input with the first control signal and configured to generate the load adjustment command and the degeneration adjustment command to fix a transconductance gain of the amplifier to a level of the first control signal;

an adjustable resistive element coupled between differential output nodes and controlled by the second control signal; and a common mode error amplifier input with the differential output voltage and a reference common mode voltage, and configured to generate the load adjustment command as an amplified replica of a difference between the differential output voltage and the reference common mode voltage.

18. The method of claim 17, wherein the adjustable resistive element comprises a transistor controlled by the second control signal and coupled between the differential output nodes.

* * * * *